(12) United States Patent
Kangas

(10) Patent No.: US 7,175,470 B2
(45) Date of Patent: Feb. 13, 2007

(54) LOCKING AND DETACHING MECHANISM FOR PLUG-IN UNIT

(75) Inventor: Simo Kangas, Vaasa (FI)

(73) Assignee: ABB Oy, Helsinki (FI)

( * ) Notice: Subject to any disclaimer, the term of this patent is extended or adjusted under 35 U.S.C. 154(b) by 0 days.

(21) Appl. No.: 10/555,697

(22) PCT Filed: May 4, 2004

(86) PCT No.: PCT/FI2004/000269

§ 371 (c)(1),
(2), (4) Date: Nov. 4, 2005

(87) PCT Pub. No.: WO2004/100634

PCT Pub. Date: Nov. 18, 2004

(65) Prior Publication Data

US 2006/0264088 A1    Nov. 23, 2006

(30) Foreign Application Priority Data

May 6, 2003    (FI) ................................ 20030676

(51) Int. Cl.
*H01R 13/00*    (2006.01)
(52) U.S. Cl. ...................... 439/483; 439/160; 439/266; 439/372; 439/476.1
(58) Field of Classification Search ................ 439/157, 439/160, 266, 372, 476.1, 483
See application file for complete search history.

(56) References Cited

U.S. PATENT DOCUMENTS 5,020,151 A * 5/1991 Sampei et al. ............. 455/345

5,791,753 A * 8/1998 Paquin ..................... 312/332.1
6,231,144 B1    5/2001 Chen et al.

FOREIGN PATENT DOCUMENTS

| DE | 41 05 948 A1 | 8/1992 |
| EP | 0 369 025 A1 | 5/1990 |
| EP | 0 626 800 B1 | 11/1994 |

OTHER PUBLICATIONS

International Search Report for PCT/FI2004/000269, dated Aug. 19, 2004.

* cited by examiner

*Primary Examiner*—James R. Harvey
(74) *Attorney, Agent, or Firm*—Buchanan Ingersoll & Rooney PC

(57) ABSTRACT

A plug-in unit assembly comprising a case (1) and a plug-in unit (2) arranged to be attached thereto, and locking means (4, 5) having a locked position and an unlocked position. The plug-in unit (2) comprises handle means (3) pivoted to turn around a pivoting axis (9). The handle means (3) have a normal position and an unlocking position for the locking means (4, 5), the turning of the handle means (3) to the unlocking position of the locking means resulting in the locking means (4, 5) moving into the unlocked position. The handle means (3) also have a detaching position for the plug-in unit, whereby turning the handle means (3) from the unlocking position of the locking means to the detaching position froth plug-in unit makes the plug-in unit (2) move a predetermined distance (D) outwards from the case (1).

13 Claims, 5 Drawing Sheets

LOCKING AND DETACHING MECHANISM FOR PLUG-IN UNIT

This disclosure is based upon Finland Application No. 20030676, filed May 6, 2003, and International Application No. PCT/FI2004/000269, filed May 4, 2004, the contents of which are incorporated herein by reference.

BACKGROUND OF THE INVENTION

The invention relates to locking and detaching mechanisms for plug-in units.

Plug-in units are generally used in electrical engineering. A plug-in unit assembly comprises a case and a plug-in unit arranged to be attached thereto. The plug-in unit comprises electrical components and related connectors arranged to be coupled to corresponding mating connectors installed in the case when the plug-in unit is being attached to its case. The electrical components installed in the plug-in unit may be instrument transformers, for example.

In plug-in unit assemblies, it is known to use locking means arranged to lock the plug-in unit immovably to the case.

In known plug-in unit assemblies, detaching the plug-in unit from the case is difficult because of the high contact forces between the connectors of the plug-in unit and the mating connectors of the case. Previously, attempts were made to solve this problem by installing a handle in the plug-in unit for facilitating the withdrawal, the handle also serving as a part of the locking means of the plug-in unit. The problem in this arrangement is that when the plug-in unit is inserted into the case, said handle has to be kept in an unlocking position, i.e. in a position enabling the withdrawal of the plug-in unit from the case. In a plug-in unit, such a handle complicates the installation of the plug-in unit into the case.

BRIEF DESCRIPTION OF THE INVENTION

The object of the invention is to provide a plug-in unit assembly, with which the above problems can be solved. The object of the invention is achieved with a plug-in unit assembly, which is characterized in what is stated in the independent claim. Preferred embodiments are described in the dependent claims.

The invention is based on providing the plug-in unit with handle means, the turning of which to a detaching position for the plug-in unit pushes the plug-in unit slightly outwards from the case.

The plug-in unit according to the invention enables a reduction in the force required to detach the plug-in unit from the case.

BRIEF DESCRIPTION OF THE FIGURES

In the following, preferred embodiments of the invention will be described in detail with reference to the accompanying drawings, in which

FIG. 2b shows an enlargement of the locking means of the plug-in unit of FIG. 2a;

FIGS. 3a and 3b illustrate the use of handle means for opening the locking means when using the plug-in unit of FIG. 2a;

FIGS. 4a and 4b illustrate the use of handle means for opening the locking means and for withdrawal of the plug-in unit outwards from the case when using the plug-in unit of FIG. 2a.

DETAILED DESCRIPTION OF THE INVENTION

Figure 1A:
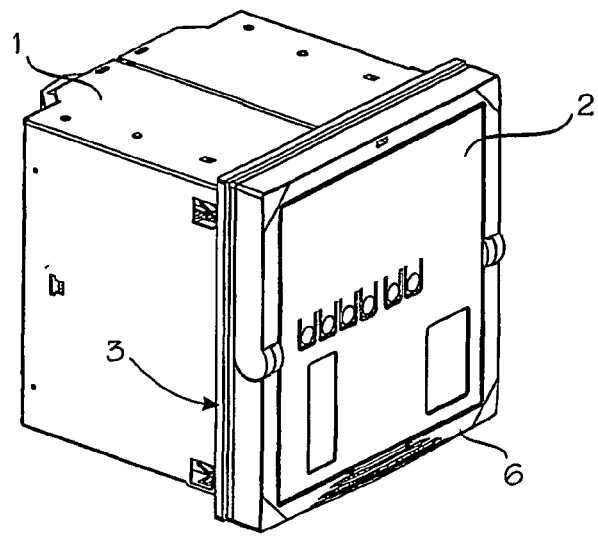
FIGS. 1a to 1c show the plug-in unit assembly according to an embodiment of the invention seen obliquely from the front.
Figure 1B:
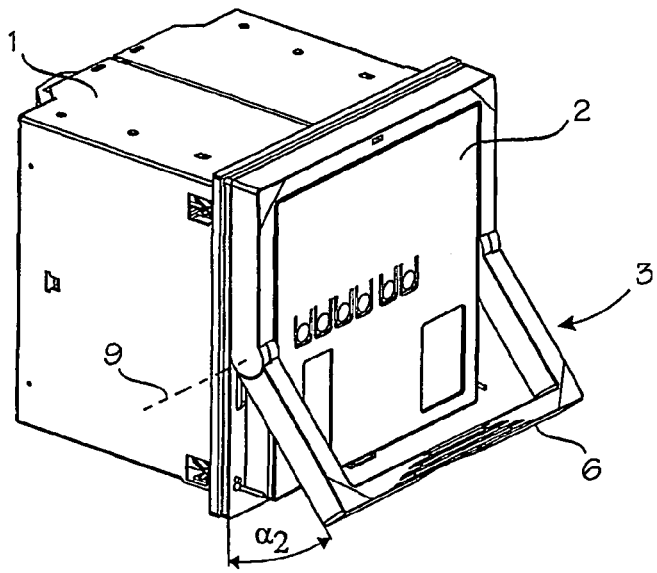
Figure 1C:
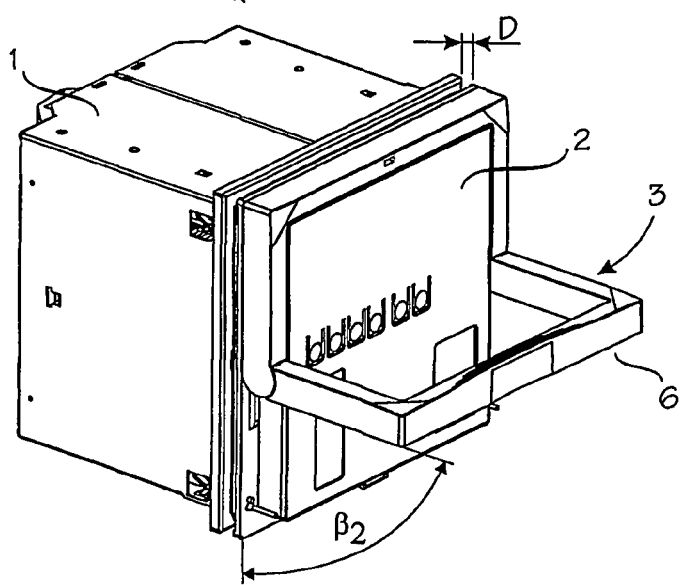

FIGS. 1a to 1c show a plug-in unit assembly according to an embodiment of the invention, comprising a case 1 and a plug-in unit 2. In the plug-in unit 2, handle means 3 are installed pivotally and they comprise a release handle 6. In FIG. 1a, the handle means 3 of the plug-in unit 2 are in a normal position, in FIG. 1b they are in an unlocking position for locking means and in FIG. 1c in a position for detaching the plug-in unit. Herein, the angle of the release handle 6 in relation to its normal position is denoted by symbol $\phi$. In the unlocking position for the locking means, the release handle 6 is at angle $\phi=\alpha_2$, and in the position for detaching the plug-in unit at angle $\phi=\beta_2$ compared with the normal position of the release handle 6.

In the embodiment of FIGS. 1a to 1c, the handle means 3 are pivoted to turn substantially around an axis parallel to the plane of the front surface of the plug-in unit 2. This pivoting axis 9 is placed horizontally and substantially in the middle of the square front surface of the plug-in unit 2. The release handle 6 is designed substantially U-shaped such that the pivoting axis 9 passes via the open ends of the U.

The plug-in unit 2 comprises electrical components, such as instrument transformers. The plug-in unit 2 also comprises connectors for said electrical components, which are coupled to corresponding mating connectors installed in the case 1 when the plug-in unit 2 is attached to its case 1.

In FIG. 1a, the handle means 3 of the plug-in unit 2 are in the normal position, i.e. in the position where they remain during the normal use of the assembly. When the handle means 3 are in the normal position, the release handle 6 is located at a plane that is essentially parallel to the plane of the front surface of the plug-in unit 2. Herein, the front surface of the plug-in unit 2 refers to the surface of the plug-in unit 2 that remains visible in normal usage of the plug-in unit assembly, i.e. in a situation when the plug-in unit 2 is inserted into the case 1. When the handle means 3 are in the normal position, the plug-in unit 2 is locked into the case 1, and the connectors of the plug-in unit 2 are coupled to the mating connectors of the case.

When the release handle 6 is turned from its normal position to the unlocking position for the locking means according to FIG. 1b, the plug-in unit 2 is no longer locked into the case 1. In the situation according to FIG. 1b, the majority of the forces resisting the withdrawal of the plug-in unit 2 from the case 1 are caused by contact forces between the connectors of the plug-in unit 2 and the mating connectors of the case 1.

In FIG. 1c, the release handle 6 is turned to angle $\phi=\beta_2$ in relation to the normal position of the release handle 6, the handle means 3 of the plug-in unit being in the position for detaching the plug-in unit. As FIG. 1c shows, the turning of the handle means 3 to the position for detaching the plug-in unit has resulted in the plug-in unit 2 moving along distance D outwards from the case 1.

When designing the assembly, the length of distance D is preferably selected such that once the plug-in unit 2 has moved along distance D outwards from the case 1, the connectors of the plug-in unit 2 and the case 1 are no longer coupled to each other. Accordingly, distance D depends, among other things, on the dimensions of the connectors of the plug-in unit 2 and the case 1, and could be about 6 mm, for example.

Figure 2A:
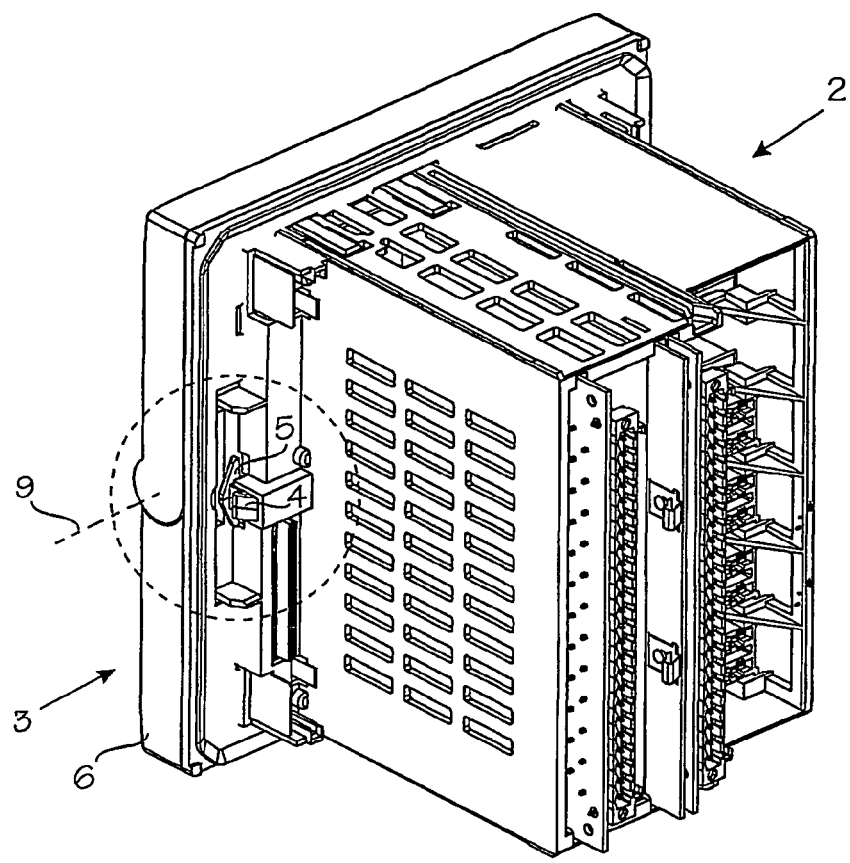
FIG. 2a shows the plug-in unit of the plug-in unit assembly of FIGS. 1a to 1c seen obliquely from the rear.
Figure 2B:
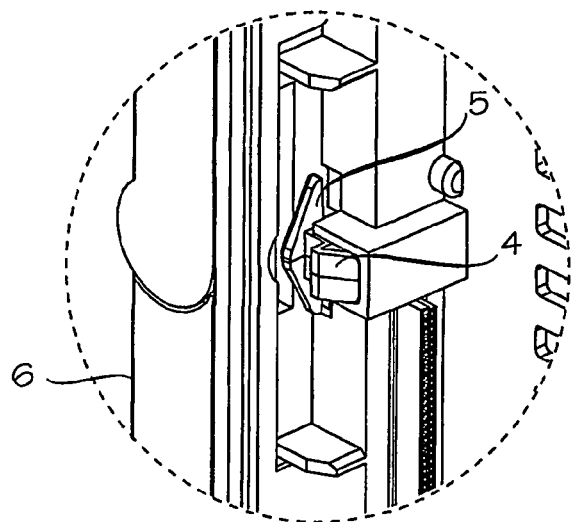

FIG. 2a shows the plug-in unit 2 of the plug-in unit assembly shown in FIGS. 1a to 1c, detached from the case 1. FIG. 2b shows an enlargement of the locking means of the plug-in unit 2 of FIG. 2a. The locking means of the plug-in unit 2 comprise a lock part 4 and a means 5 for using the lock part.

The lock part 4 is provided with spring means (not shown). In FIGS. 2a and 2b, the lock part 4 is in its outermost operational position, said spring means tending to return the lock part 4, provided it is pushed inward, from said outermost operational position. Herein, pushing the lock part 4 inward refers to moving the lock part 4 inward in relation to the plug-in unit 2, i.e. away in relation to the case 1. In the case of the embodiment presented, the lock part 4 and the means 5 for using the lock part, integral therewith, are pressed inwards in a direction substantially parallel to the plane of the front surface of the plug-in unit 2. The lock part 4 of the plug-in unit 2 is arranged to co-operate with a counterpart of the lock part (not shown) installed in the case 1.

The shape and operation of the lock part 4 of the plug-in unit shown in FIGS. 2a to 3b resemble those of a latch bolt used in doors of buildings. The lock part 4 has a bevelled rear surface and a substantially straight front surface. Herein, the front surface of the lock part 4 is defined as the surface that is closer to the above-defined front surface of the plug-in unit 2. Correspondingly, the rear surface of the lock part 4 is the surface that is farther away from the front surface of the plug-in unit 2 than the front surface of the lock part 4.

When the plug-in unit 2 is pushed a predetermined distance to the inside of the case 1, the rear surface of the lock part 4 is connected to the counterpart of the lock part installed in the case 1. The rear surface of the lock part 4 is bevelled such that it co-operates with the counterpart of the lock part, making the lock part 4 start to retract inwards as the plug-in unit 2 is being continuously pushed into the case 1. When the pushing of the plug-in unit 2 into the case 1 is continued, a situation is reached where the lock part 4 has moved past the counterpart of the lock part, whereby the spring means of the lock part 4 push the lock part 4 outwards towards their outermost operational position. The pushing outwards of the lock part 4 behind the counterpart of the lock part results in the plug-in unit 2 being locked into the case 1. The locking position of the lock part 4 is preferably substantially the same as the outermost operational position of the lock part 4, i.e. a position where the lock part 4 is located when the plug-in unit 2 is detached from the case 1.

There may be one or more lock parts 4 in the plug-in unit assembly of the invention. In the plug-in unit 2 according to the embodiment shown in the figures, the lock parts 4 are on both sides of the plug-in unit 2. Alternatively, an assembly according to the invention can be implemented, wherein at least one lock part 4 is placed in the case 1, the counterpart of said lock part being placed in the plug-in unit 2.

In the plug-in unit assembly of the invention, the locking means that lock the plug-in unit 2 into the case 1 can be opened by using the handle means 3. FIGS. 3a to 4b illustrate the use of the handle means for opening the locking means.

In the embodiment shown in the figures, the locking means comprise, for each lock part 4, a means 5 for using the lock part, the means comprising a substantially triangular part seen from the direction of the front surface of the plug-in unit 2, the vertex of the triangle pointing outwards from the plug-in unit 2. The means 5 for using the lock part can be integral with the lock parts 4, as in the embodiment shown, or they may be separate parts.

Figure 3A:
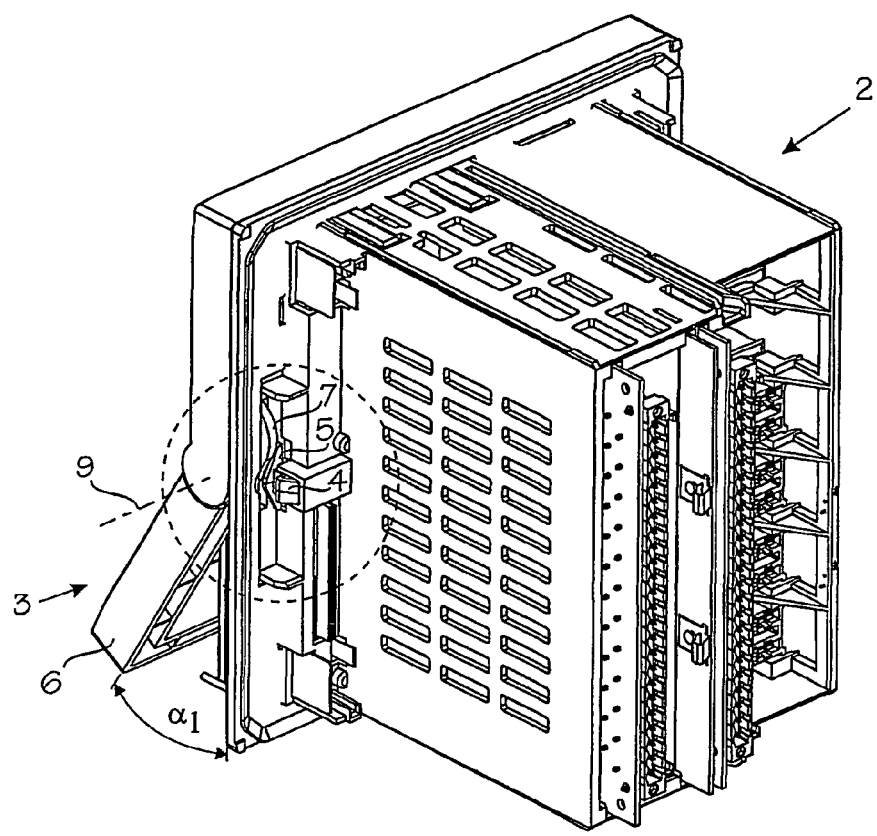
Figure 3B:
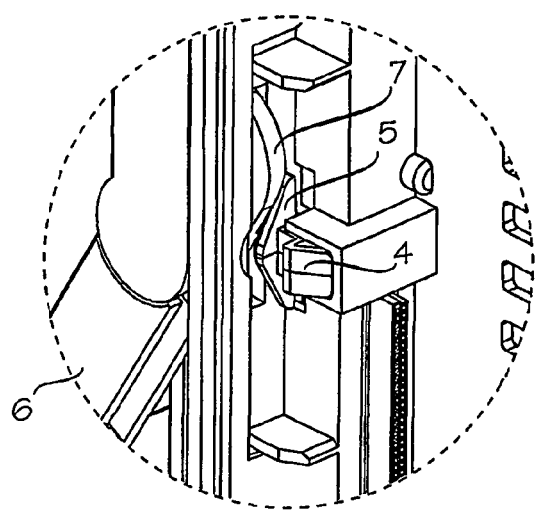

In FIG. 3a, the release handle 6 of the handle means 3 is turned by angle $\alpha_1$ in relation to the normal position of the release handle 6. In this case, engagement means 7 of the handle means 3 are being coupled to the means 5 for using the lock part. Angle $\alpha_1$ may be in the range $0° \leq \alpha_1 < 45°$, for example. The engagement means 7 of the handle means 3 comprise two projections located substantially on the opposite side of the pivoting axis 9 of the handle means relative to the release handle 6. Accordingly, in a manner of speaking, the engagement means 7 constitute extensions at the ends of the U-shaped release handle.

When the release handle 6 is turned, the engagement means 7 move at a plane that is substantially perpendicular to the front surface of the plug-in unit 2. When the release handle 6 of the handle means 3 is turned to a position where its angle $\phi$ in relation to its normal position is larger than $\alpha_1$, the engagement means 7 of the handle means 3 are coupled to the bevelled part of the means 5 for using the lock part such that the means 5 for using the lock part and the lock parts 4, integral therewith, move inward. When the angle of the release handle 6 is in the range $\alpha_1 < \phi < \alpha_2$, the means 5 for using the lock part move when the release handle is turned. The movements of the engagement means 7 and the means 5 for using the lock part occur in planes perpendicular to each other. The movement of the assembly constituted by the lock part 4 and the means 5 for using the lock part occurs substantially in parallel in relation to the pivoting axis 9 of the handle means.

When the release handle 6 reaches a position where its angle $\phi$ in relation to its normal position is $\alpha_2$, the lock parts 4 reach their unlocked position, wherein they do not prevent the withdrawal of the plug-in unit 2 from the case 1. Angle $\alpha_2$ is larger than angle $\alpha_1$. Preferably, angle $\alpha_2$ is smaller than 90°, allowing the plug-in unit 2 to be withdrawn from the case 1 when the release handle is at a 90° angle in relation to its normal position. To facilitate the detachment of the plug-in unit 2, angle $\alpha_2$ is preferably selected significantly smaller than 90°, whereby angle $\alpha_2$ could be in the range $20° \leq \alpha_2 \leq 45°$, for example.

The difference between angles $\alpha_2$ and $\alpha_1$ could be in the range $3° \leq \alpha_2 - \alpha_1 \leq 30°$, for example. If the difference between angles $\alpha_2$ and $\alpha_1$ is too small, the engagement means 7 and the means 5 for using the lock part could be subjected to unnecessarily high stresses when the locking of the plug-in unit 2 is unlocked.

Preferably, the handle means 3 are arranged to push the lock parts 4 somewhat deeper than is required by the opening of the locking. In other words, the handle means 3 are preferably arranged to continue pushing the lock parts 4 inward also when the turning angle $\phi$ is somewhat larger than $\alpha_2$. This ensures the desired operation of the locking means in all situations.

When the turning angle $\phi$ of the release handle 6 is larger than or equal to $\beta_1$, and the turning of the release handle is continued in a direction where angle $\phi$ increases, the handle means 3 push the plug-in unit 2 outwards from the case 1.

Angle $\beta_1$ is preferably larger than or equal to angle $\alpha_2$, i.e. the turning of the release handle 6 preferably starts to push the plug-in unit 2 out of the case 1 only when the locking of the plug-in unit 2 in relation to the case 1 is entirely removed.

Figure 4A:
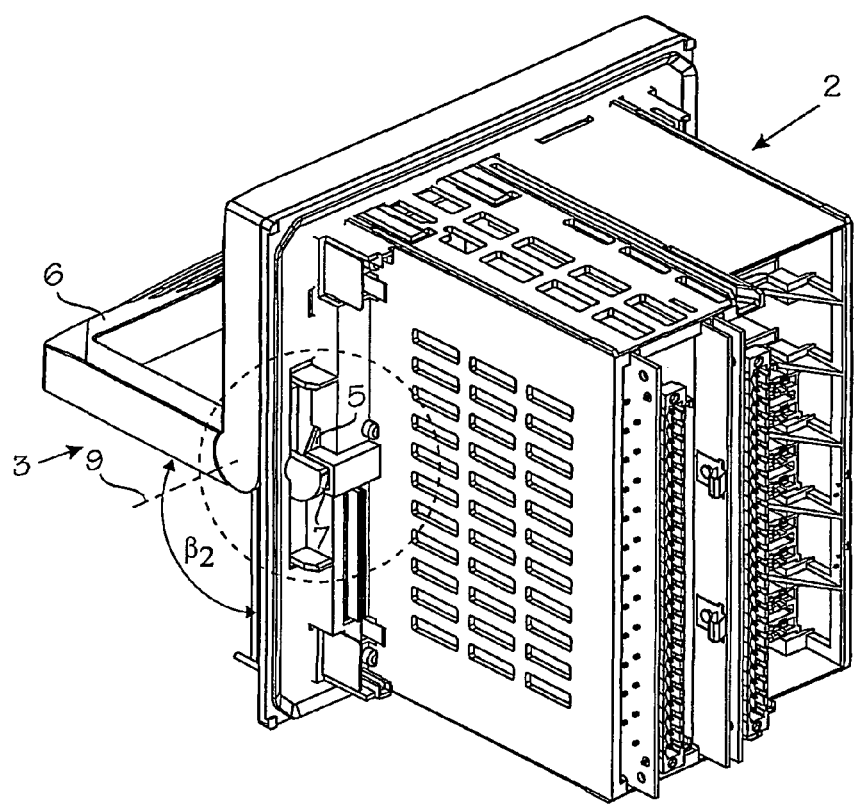
Figure 4B:
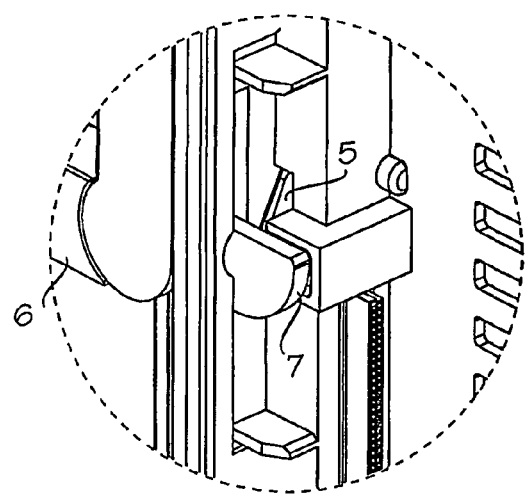

FIGS. 4a and 4b show a situation where the handle means 3 are turned to the position for detaching the plug-in unit, where angle $\phi$ of the release handle 6 is $\beta_2$ in relation to its normal position. In FIGS. 4a and 4b, the outermost end of the engagement means 7 is closer to the rear surface of the plug-in unit 2 than in FIGS. 3a and 3b. This change in the position of the engagement means 7 is used to achieve the movement of the plug-in unit 2. The principle, according to which the engagement means 7 achieve the movement of the plug-in unit 2 outwards from the case 1, is shown in FIGS. 5a and 5b in a simplified manner.

Figure 5A:
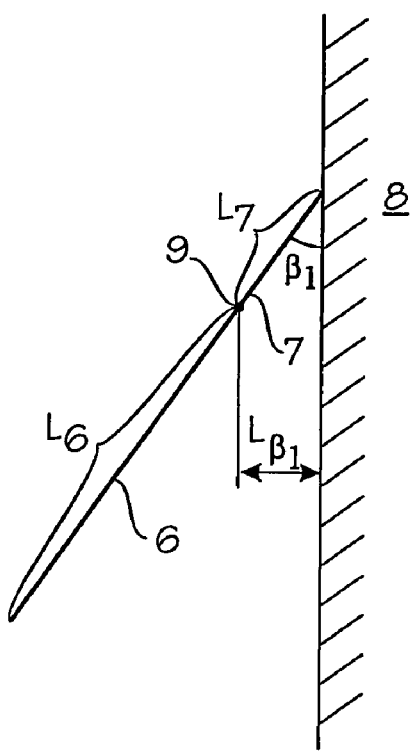
FIGS. 5a and 5b show a simplified view of the principle according which the handle means achieve the movement of the plug-in unit outwards from the case.
Figure 5B:
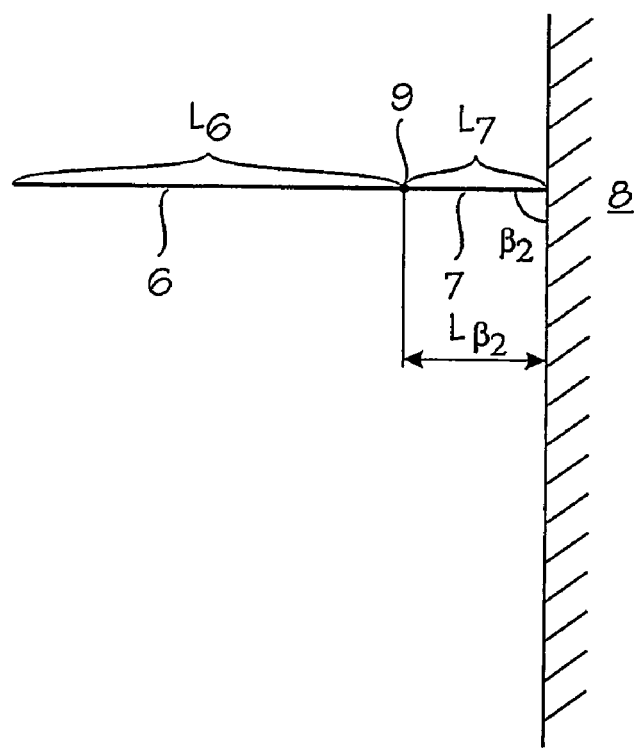

In FIGS. 5a and 5b, the release handle 6 and the engagement means 7 are shown by a line-like piece, and support means 8, installed in the case 1 and arranged to cooperate with the engagement means 7, are shown by a vertical wall. FIGS. 5a and 5b show the pushing out of the plug-in unit 2 seen from the direction of the pivoting axis 9 of the handle means 3. In this simplified example, the normal position of the release handle 6 is parallel to the wall constituting the support means 8. Since the combination of the release handle 6 and the engagement means 7 is shown by the same line-like piece, their angles in relation to the wall constituting the support means 8 are identical.

FIG. 5a shows a situation where the plug-in unit 2 is installed in the case 1 in its normal operational position, and the release handle 6 is in a position where its angle $\phi$ in relation to its normal position is $\beta_1$. This being so, the engagement means 7 of the handle means 3 are coupled to the support means 8 installed in the case 1, the distance of the pivoting axis 9 from the support means 8 being $L_{\beta 1}$.

When angle $\phi$ is larger than or equal to $\beta_1$, but smaller than $\beta_2$, and the release handle 6 is turned in a direction where angle $\phi$ continues to increase, the engagement means 7 of the handle means 3 and the support means 8 installed in the case 1 cooperate to push the plug-in unit 2 outwards from the case 1.

FIG. 5b shows a situation where the release handle 6 has reached the position for detaching the plug-in unit, its angle $\phi$ in relation to its normal position being $\beta_2$. This being so, the distance of the pivoting axis 9 of the handle means 3 from the support means 8 is $L_{\beta 2}$. Since the pivoting axis 9 is fixed in relation to the plug-in unit 2, and the support means 8 are fixedly installed in the case 1, the plug-in unit 2 has extended outwards from the case 1 along a distance equal to the difference between distances $L_{\beta 2}$ and $L_{\beta 1}$ as compared with its normal operational position.

When the plug-in unit 2 is pushed outwards from the case 1 by means of the engagement means 7, in the case of the example of FIGS. 5a and 5b, distance L of the pivoting axis 9 in relation to the support means 8 can be expressed by the formula $$L = L_7 \cdot \sin\phi,$$

wherein $L_7$ is the distance of the end of the engagement means 7 from the pivoting axis 9. Consequently, distance D, along which the plug-in unit 2 extends outwards from the case 1 when the release handle 6 is turned from its normal position to the position for detaching the plug-in unit is obtained from the formula $$D = L_7 \cdot (\sin\beta_2 - \sin\beta_1).$$

In the case of the example shown in FIGS. 5a and 5b, turning the release handle 6 to the position for detaching the plug-in unit decreases the force required in the detachment of the plug-in unit 2, since the handle means 3 utilize a lever arm. In order for the handle means 3 to operate as a lever arm in the desired manner, the point in the release handle 6 which the person detaching the plug-in unit 2 can grab has to be located substantially farther away from the pivoting axis 9 of the handle means 3 than the end of the engagement means 7 coupled to the support means 8. The distance of the point in the release handle 6 that the person detaching the plug-in unit 2 can grab in relation to the pivoting axis 9 is designated by $L_6$ in FIGS. 5a and 5b.

In such plug-in unit assemblies according to the invention, wherein the handle means 3 are pivoted to turn substantially around an axis parallel to the plane of the front surface of the plug-in unit 2, such as in the embodiment shown in the figures, angle $\beta_2$ may vary substantially in the range $\beta_1 < \beta_2 \leq 180°$. In the case of the embodiment shown in the figures, $\beta_2$ is about 90°. When designing the assembly, the difference between angles $\beta_2$ and $\beta_1$ is preferably selected sufficiently large in order for the force required for turning the release handle 6 to be sufficiently low.

It is evident to a person skilled in the art how the values of angles $\beta_1$ and $\beta_2$ can be determined by the design and placement of the handle means 3 and the support means 8. It is also evident how the values of angles $\alpha_1$ and $\alpha_2$ can be determined by the design and placement of the handle means 3 and the locking means.

In the plug-in unit assembly of the invention, the plug-in unit 2 can be withdrawn from the case 1 even if the handle means 3 are not turned up to the position for detaching the plug-in unit. In other words, the plug-in unit can be detached when $\phi \geq \alpha_2$.

If the aim is to minimize the force required for the withdrawal of the plug-in unit 2, the handle means 3 are turned to the detaching position for the plug-in unit before the plug-in unit 2 is withdrawn from the case. In assemblies wherein $\beta_2 > 90°$, the plug-in unit 2 can be withdrawn by turning the release handle 6 first to angle $\beta_2$ for detaching the connectors of the plug-in unit 2 and the case 1 from each other, and then turning the release handle 6 somewhat back such that the release handle takes an advantageous withdrawal angle, which in the case of the exemplary assembly shown in the figures is about 90°.

In the embodiment shown in the figures, the plug-in unit 2 may be inserted into the case 1 when the handle means 3 are in their normal position. In this case, the insertion of the plug-in unit 2 into the case 1 is easy, since the plug-in unit 2 can be pushed without obstacle at its front surface without the handle means 3 complicating the pushing.

The handle means 3, which comprise the release handle 6 and the engagement means 7 in the above-described manner, are preferably formed integral. The handle means 3 can be made from a plastic material, for example.

It is obvious to a person skilled in the art that the basic idea of the invention can be implemented in a variety of ways. The invention and its embodiments are thus not limited to the above examples, but may vary within the scope of the claims.

The invention claimed is:

1. A plug-in unit assembly comprising a case and a plug-in unit arranged to be attached thereto, the plug-in unit comprising at least one electrical component having at least one connector, and the case comprising at least one connector arranged to be coupled to the connector in said plug-in unit when the plug-in unit is attached to the case, the plug-in unit assembly also comprising locking means having a locking position and an unlocked position, the plug-in unit being locked substantially immovably to the case when the plug-in unit is attached to the case and the locking means are in the locking position, and the plug-in unit being detachable from the case when the locking means are in the unlocked position, the plug-in unit comprising handle means that are pivoted to turn around a pivoting axis and comprise a release handle arranged for turning the handle means around the pivoting axis, and the handle means having a normal position and an unlocking position for the locking means, the turning of the handle means to the unlocking position for the locking means causing the moving of the locking means to the unlocked position when the plug-in unit is locked into the case, wherein the handle means also have a position for detaching the plug-in unit, whereby the turning of the handle means further from the unlocking position for the locking means to the position for detaching the plug-in unit causes the plug-in unit to move along a predetermined distance outwards from the case, and wherein the locking means comprise at least one movable lock part provided with spring means, and at least one means for using the movable lock part and arranged to function with the lock part in a manner enabling the movement of the lock part by moving the means for using the lock part, and wherein said at least one lock part is integral with said at least one means for using the lock part, and wherein said assembly constituted by the lock part and the means for using the lock part is arranged to move substantially in parallel in relation to the pivoting axis of the handle means.

2. A plug-in unit assembly as claimed in claim 1, wherein in the unlocking position for the locking means the release handle is turned around the pivoting axis along a predetermined first angle in relation to its normal position, and in the position for detaching the plug-in unit the release handle is turned around the pivoting axis along a predetermined second angle in relation to its normal position.

3. A plug-in unit assembly as claimed in claim 1, wherein said predetermined distance is sufficient for detaching said connector in the plug-in unit from a corresponding connector in the case.

4. A plug-in unit assembly as claimed in claim 1, wherein said at least one lock part is placed in the plug-in unit, the counterpart of this lock part being placed in the case.

5. A plug-in unit assembly as claimed in claim 4, wherein the handle means comprise engagement means arranged to cooperate with the means for using said at least one lock part for moving a corresponding at least one lock part.

6. A plug-in unit assembly as claimed in claim 5, wherein the case comprises support means arranged to cooperate with the engagement means for moving the plug-in unit along a predetermined distance outwards from the case when the handle means are turned to the position for detaching the plug-in unit.

7. A plug-in unit assembly as claimed in claim 1, wherein the pivoting axis is substantially parallel to the plane of the front surface of the plug-in unit.

8. A plug-in unit assembly as claimed in claim 1, wherein when the handle means are in their normal position, the release handle is located at a plane that is substantially parallel to the plane of the front side of the plug-in unit.

9. A plug-in unit assembly as claimed in claim 2, wherein said predetermined first angle is larger than or equal to 15°, but smaller than or equal to 45°, and wherein said predetermined second angle is larger than said predetermined first angle but smaller than or equal to 180°.

10. A plug-in unit assembly as claimed in claim 2, wherein the difference between said predetermined second angle and said predetermined first angle is larger than or equal to 45°.

11. A plug-in unit assembly as claimed in claim 1, wherein the release handle is substantially U-shaped, and wherein the pivoting axis passes via the open heads of the U.

12. A plug-in unit assembly as claimed in claim 11, wherein the engagement means of the handle means comprise two projections provided at corresponding ends of the U-shaped release handle and located substantially on the opposite side of the pivoting axis of the handle means than the release handle.

13. A plug-in unit assembly as claimed in claim 1, wherein the assembly is arranged such that the plug-in unit is insertable into the case when the handle means are in their normal position.

* * * * *